US009260654B2

(12) United States Patent
Washizu et al.

(10) Patent No.: US 9,260,654 B2
(45) Date of Patent: Feb. 16, 2016

(54) MANUFACTURING METHOD FOR LIGHT EMITTING DEVICE AND PHOSPHOR MIXTURE

(75) Inventors: Takashi Washizu, Hachioji (JP); Takuji Hatano, Suita (JP); Yoshihito Taguchi, Kawasaki (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/003,920

(22) PCT Filed: Feb. 15, 2012

(86) PCT No.: PCT/JP2012/053578
§ 371 (c)(1),
(2), (4) Date: Sep. 9, 2013

(87) PCT Pub. No.: WO2012/124426
PCT Pub. Date: Sep. 20, 2012

(65) Prior Publication Data
US 2013/0344633 A1    Dec. 26, 2013

(30) Foreign Application Priority Data
Mar. 11, 2011   (JP) .................. 2011-053766

(51) Int. Cl.
*H01L 33/50*     (2010.01)
*C08G 77/50*     (2006.01)
*C09K 11/02*     (2006.01)
(Continued)

(52) U.S. Cl.
CPC .............. *C09K 11/025* (2013.01); *H01L 33/26* (2013.01); *H01L 33/501* (2013.01); *H05B 33/10* (2013.01); *H01L 2933/0041* (2013.01)

(58) Field of Classification Search
None
See application file for complete search history.

(56) References Cited

U.S. PATENT DOCUMENTS

| 7,390,684 B2 | 6/2008 | Izuno et al. | |
| 2005/0228104 A1* | 10/2005 | Feeney | C09D 7/1291 524/445 |
| 2007/0148442 A1* | 6/2007 | Shibayama | C08L 63/00 428/336 |

(Continued)

FOREIGN PATENT DOCUMENTS

| JP | 6-200153 A | 7/1994 |
| JP | 2000-349347 A | 12/2000 |

(Continued)

OTHER PUBLICATIONS

International Search Report of PCT/JP2012/053578 dated Apr. 3, 2012.

(Continued)

*Primary Examiner* — Pamela E Perkins
(74) *Attorney, Agent, or Firm* — Lucas & Mercanti, LLP

(57) ABSTRACT

Disclosed is a manufacturing method for a light emitting device including a light emitting element and a wavelength converting part which converts light emitted from the light emitting element into light of another wavelength. The manufacturing method includes a first step and a second step. The first step is a step of applying onto the light emitting element and drying a first liquid mixture in which phosphor and plate-like particles are dispersed in polyhydric alcohol having a valence of two or more to form a phosphor layer. The second step is a step of applying onto the phosphor layer and firing a second liquid mixture in which a translucent ceramic precursor is dispersed in a solvent to form the wavelength converting part.

19 Claims, 2 Drawing Sheets

(51) Int. Cl.
*H01L 33/26* (2010.01)
*H05B 33/10* (2006.01)

(56) References Cited

U.S. PATENT DOCUMENTS

2007/0299169 A1* 12/2007 Ohira et al. .................. 524/100
2011/0215348 A1* 9/2011 Trottier et al. ................ 257/89
2012/0184674 A1* 7/2012 Hamada et al. ............... 524/858
2014/0080235 A1* 3/2014 Yajima .................. H01L 33/505
  438/27

FOREIGN PATENT DOCUMENTS

| JP | 2004153109 A | 5/2004 |
| JP | 2006-257385 A | 9/2006 |
| JP | 2008-24774 A | 2/2008 |
| JP | 2008-45088 A | 2/2008 |
| JP | 2010-3776 A | 1/2010 |

OTHER PUBLICATIONS

PCT International Preliminary Report on Patentability and Written Opinion, International Application No. PCT/JP2012/053578, International Filing Date Feb. 15, 2012, date is issuance Sep. 17, 2013 (9 pages).

Chinese Office Action from corresponding application.

English Translation of Chinese Office Action.

* cited by examiner

MANUFACTURING METHOD FOR LIGHT EMITTING DEVICE AND PHOSPHOR MIXTURE

CROSS-REFERENCE TO RELATED APPLICATIONS

This application is a 371 of PCT/JP2012/053578 filed on Feb. 15, 2012, which dams the priority of Japanese Application Serial No. 2011-053766 filed on Mar. 11, 2011, the contents of each of which are incorporated herein by reference.

FIELD OF THE INVENTION

The present invention relates to a manufacturing method for a light emitting device and a phosphor mixture which is suitably used in the manufacturing method.

BACKGROUND OF THE ART

Hitherto, there has been developed, to be used for an illuminator or the like a light emitting device which produces white light by making phosphor emit, light by using light emitted from a light emitting element such as an LED element as excitation light.

As such a light emitting device, there is known, for example, a light emitting device which produces white light by using phosphor which emits yellow light through blue light emitted from a light emitting element and mixing the colors of light or a light emitting device which produces white light by using phosphor which emits blue light, green light and red light through ultraviolet light emitted from a light emitting element and mixing the three colors of light.

As a light emitting device having such a configuration, there has been developed a light emitting device in which a light emitting element is directly sealed with curable resin in which phosphor is dispersed. Uses of light emitting devices have expanded to a field which requires high brightness such as a headlight for a car. Because of this and so forth, in recent years, light emitting elements have been high-powered ones and accordingly generate heat. Therefore, when phosphor is provided directly on a light emitting element in such a way as to be dispersed in a sealing agent as described above, the sealing agent may deteriorate by heat generated by the light emitting element.

In order to solve this problem, there is proposed in Patent Document 1 a technique to prevent deterioration of a sealing agent, the technique by which phosphor is dispersed not in resin but in a ceramic solution (ceramic precursor solution) so that a light emitting element is sealed with ceramics which do not deteriorate much by heat.

Although the technique disclosed in Patent Document 1 can provide durability for a light emitting element, when phosphor is mixed with a ceramic precursor solution and the liquid mixture is applied onto a light emitting element, the phosphor precipitates in the liquid mixture because the specific gravity of phosphor is high. Hence, it is difficult to make phosphor evenly exist on a light emitting element, so that released white light is uneven, and accordingly chromaticity varies between light emitting devices.

Further, when an application liquid, in which phosphor is dispersed in a ceramic precursor solution is applied, to a package on which a light emitting element is mounted, a mask component is usually used so that an application region for the application liquid is limited to a predetermined region. However, the phosphor adhering onto a mask component is often discarded. Because phosphor is expensive in general, it is desired that the phosphor adhering onto a mask component is also collected and reused.

The inventors of the present invention gave consideration to this problem and found that the viscosity of an application liquid was able to be increased, phosphor thereof was able to be prevented from precipitating, and evenness of the application was able to be obtained by using polyhydric alcohol having a valence of two or more as a solvent of the application liquid and mixing certain particles therewith. Although, a technique using polyhydric alcohol is introduced in Patent Document 2, the technique disclosed in Patent Document 2 uses polyhydric alcohol as a mere additive (surface hardening retarder) (Paragraphs 0012-0014, 0021, etc.), which is totally different in purpose from the case where polyhydric alcohol is used as a solvent of an application liquid.

However, in the technique by which polyhydric alcohol is used as a solvent of an application liquid in which phosphor is dispersed in a ceramic precursor solution, the phosphor adhering onto a mask component was covered with ceramics formed by the ceramic precursor solution and accordingly fixed onto the mask component, so that the phosphor was not able to be collected or reused.

Then, consideration was given again, and it was decided to apply phosphor and a ceramic precursor solution separately.

More specifically, it was decided (i) to apply onto a light emitting element and dry a liquid mixture in which phosphor is dispersed in polyhydric alcohol to form a phosphor layer and then (ii) to apply onto the phosphor layer and fire a ceramic precursor solution to fix the phosphor of the phosphor layer onto the light emitting element.

By this two-step application, before a ceramic precursor solution was applied, a mask component was collected, and accordingly phosphor was able to be collected from the mask component to be reused.

RELATED ART DOCUMENT

Patent Document

Patent Document 1: Japanese Patent Application Laid-Open Publication No. 2000-349347
Patent Document 2: Japanese Patent Application Laid-Open Publication No. 2010-3776

SUMMARY OF THE INVENTION

The Problems to be Solved by the Invention

However, at the second step at which a ceramic precursor solution was applied to a phosphor layer, when the phosphor layer did not have a certain degree of strength, a phenomenon of separation, of the phosphor layer occurred.

For example, when a liquid mixture of the first step was applied with a spray, and then a liquid mixture of the second step was applied with the spray, a phosphor layer was separated from a light emitting element because of the air pressure of the spray.

In order to increase the strength of phosphor layers, typical oxide fine particles or the like was mixed, into a liquid mixture. However, the strength of phosphor layers was not increased. Further, a polymer additive was mixed therein. However, coloring occurred at the time of heating, and accordingly the chromaticity of the luminous color itself varied.

Therefore, a main object of the present invention is to provide a manufacturing method for a light emitting device and a phosphor mixture suitably used in the manufacturing method each of which can prevent separation of a phosphor layer formed at a first step and reduce the chromaticity variation when an application liquid is applied at two steps, namely, the first step of applying a liquid mixture containing phosphor and the second step of applying a liquid mixture containing a ceramic precursor.

Means for Solving the Problems

In order to solve the above-described problems, according to an aspect of the present invention, there is provided a manufacturing method for a light emitting device including a light emitting element and a wavelength converting part which converts light emitted from the light emitting element into light of another wavelength, the manufacturing method including:

a step of applying onto the light emitting element and drying a first liquid mixture in which phosphor and plate-like particles are dispersed in polyhydric alcohol having a valence of two or more to form a phosphor layer; and a step of supplying onto the phosphor layer and firing a second liquid mixture in which a translucent ceramic precursor is dispersed in a solvent to form the wavelength converting part.

According to another aspect of the present invention, there is provided a phosphor mixture used in a manufacturing method for a light emitting device including a light emitting element and a wavelength converting part which converts light emitted from the light emitting element into light of another wavelength, the manufacturing method including: a step of applying onto the light emitting element and drying a first liquid mixture to form a phosphor layer; and a step of applying onto the phosphor layer and firing a second liquid mixture in which a translucent ceramic precursor is dispersed in a solvent to form the wavelength converting part and the phosphor mixture comprising: phosphor; plate-like particles; and polyhydric alcohol having a valence of two or more, wherein the phosphor mixture is a liquid mixture in which phosphor and plate-like particles having a particle size smaller than a particle size of the phosphor are dispersed in polyhydric alcohol having a valence of two or more and is used as the first liquid mixture.

Advantageous Effects of the Invention

According to the present invention, particular plate-like particles are contained in the first liquid mixture or the phosphor mixture, so that the strength of phosphor layers is increased and separation of the phosphor layers can be prevented, and by extension, the chromaticity variation of manufactured light emitting devices can be reduced.

EMBODIMENT FOR CARRYING OUT THE INVENTION

In the following, a preferred embodiment of the present invention is described with reference to the drawings.

Figure 1:
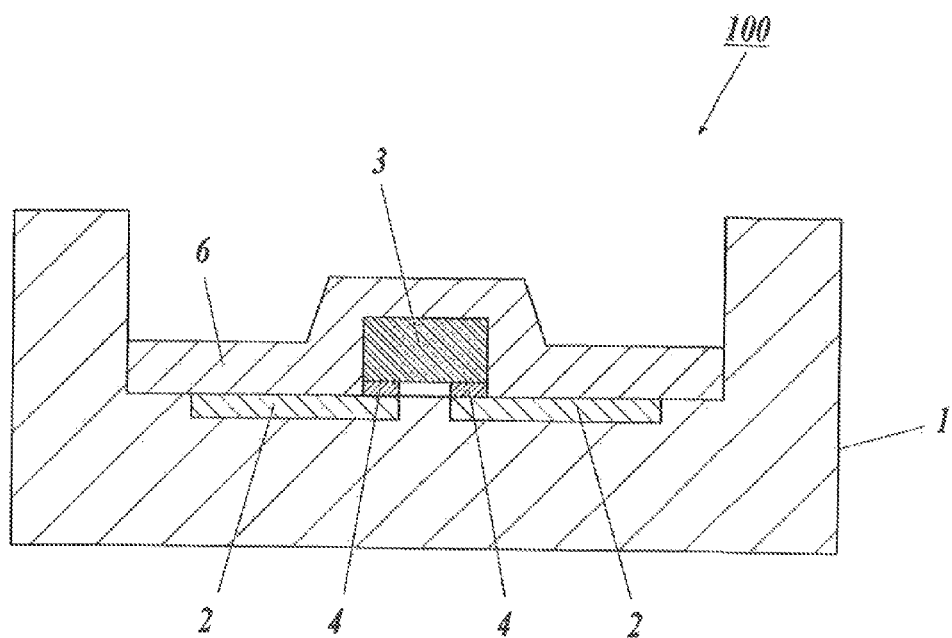
FIG. 1 is a cross-sectional view schematically showing the configuration of a light emitting device.

As shown in FIG. 1, a light emitting device 100 has a package 1 which is concave in a cross-sectional view. On a concave part (bottom part) of the package 1, a metal part 2 (wiring) is disposed, and over the metal part 2, a cuboid LED element 3 as a light emitting element is disposed. The LED element 3 is an example of a light emitting element which emits light of a predetermined wavelength. On a surface of the LED element 3, the surface facing the metal part 2, a protruding electrode 4 is disposed, and the metal part 2 and the LED element 3 are connected to each other via the protruding electrode 4 (flip-chip bonding).

In the embodiment, as the LED element 3, a blue LED element is used. The blue LED element is formed by disposing sin n-GaN cladding layer, an InGaN light emitting layer, a p-GaN cladding layer and a transparent electrode on a sapphire substrate, for example.

On the concave part of the package 1, a wavelength converting part 6 is formed in such a way as to seal the periphery of the LED element 3. The wavelength converting part 6 is a part which converts light of a predetermined wavelength emitted from the LED element 3 into light of a long wavelength which is different from the predetermined wavelength. The wavelength converting part 6 has a translucent ceramic layer into which phosphor is added, the phosphor being excited by a wavelength of light emitted from the LED element 3 and emitting fluorescence of a wavelength which is different from the excitation wavelength.

In the embodiment, the wavelength converting part 6 is formed in such a way as to seal the periphery of the LED element 3. What is necessary here is that the wavelength converting part 6 is disposed on the periphery (the upper surface and the lateral surfaces) of the LED element 3, and hence the wavelength converting part 6 may be configured not to be disposed on the concave part of the package 1. As a method for disposing the wavelength converting part 6 only on the periphery of the LED element 3, there is used a method of setting a mask when the wavelength converting part 6 is formed, for example.

Next, a manufacturing method for the light emitting device 100 is described.

The manufacturing method for the light emitting device 100 mainly includes (1) a step of applying onto the LED element 3 and drying a first liquid mixture (phosphor application liquid) in which phosphor and plate-like particles are dispersed in polyhydric alcohol having a valence of two or more to form a phosphor layer and (2) a step of applying onto the phosphor layer and firing a second liquid mixture in which a translucent ceramic precursor is dispersed in a solvent to form the wavelength converting part 6.

First, the phosphor, the plate-like particles, the dispersion medium, and the first liquid mixture, which are used at the step (1), and details of the step (1) are described.

(1.1) Phosphor

The phosphor is one which is excited by a wavelength (excitation wavelength) of light emitted from the LED element 3 and emits fluorescence of a wavelength which is different from the excitation wavelength. In the embodiment, YAG (yttrium aluminum garnet) phosphor which converts blue light (wavelength; 420 nm to 485 nm) emitted from a blue LED element into yellow light (wavelength; 550 nm to 650 nm) is used.

As the phosphor, Y, Gd, Ce, Sm, Al, La and/or Ga oxides and/or a compound which easily becomes oxide at a nigh temperature are used, and they are well mixed in a stoichiometric ratio so that a mixed material is obtained. Alternatively, coprecipitation oxide which is obtained by carrying out coprecipitation with nitric acid on a solution in which Y, Gd, Ce and Sm of rare-earth elements are dissolved in acid in a stoichiometric ratio and firing the resulting product, aluminum oxide and gallium oxide are mixed so that a mixed material is obtained. Then, as a flux, a proper amount of fluoride such as ammonium fluoride is mixed with the obtained mixed material, and the resulting product is pressed, whereby a compact is obtained. A crucible is filled with the obtained compact, and the compact was fired for two to five hours at a temperature range of 1350° C. to 1450° C. in the air, whereby a sintered compact having luminescence property of the phosphor is obtained.

In the embodiment, the YAG phosphor is used. However, the type of the phosphor is not limited thereto, and hence other phosphor such as non-garnet phosphor not containing Ce can also be used. The larger the particle size of the phosphor is, the higher the light emission efficiency (wavelength conversion efficiency) is, but also the larger a gap produced on the interface with an organic metal compound is, and accordingly the lower the film strength of the formed ceramic layer is. Therefore, in view of both the light emission efficiency and the size of the gap produced on the interface with the organic metal compound, it is preferable that the phosphor having an average particle size of 1 μm or more and 50 μm or less be used. The average particle size of the phosphor can be measured by using, for example, a particle size analyzer SALD7000 manufactured by Shimadzu Corporation.

(1.2) Additive (1.2.1) Plate-Like Particle

At the time of drying, the plate-like particles overlap with each other on a plane, thereby having an effect of pressing the phosphor particles with the plane, so that the strength of the phosphor layer is high.

The plate-like particles have an average aspect ratio of 10 or more.

The average aspect ratio is the average of aspect ratios of individual plate-like particles. The aspect ratio means a value obtained by dividing a diameter of a corresponding circle having the area equal to the projected area of each of two principle planes of a plate-like particle by the thickness which is defined by the largest value among distances between the two principle planes of the particle.

The average aspect ratio of the plate-like particles is 10 or more, preferably 20 or more. By such plate-like particles being selected, the particles overlap with each other on a plane at the time of drying, thereby having the effect of pressing the phosphor particles with the plane, so that the strength of the phosphor layer is high.

The plate-like particles having the particle size smaller than the particle size of the phosphor are used. It is preferable to use the plate-like particles having an average particle size of 1 nm or more and 5 μm or less.

The thickness of the plate-like particles is preferably 1 μm or less and far preferably 0.1 μm or less.

The shapes of these can be viewed by using a transmission electron microscope, and the average particle size can be measured by using a particle size analyzer SALD-7000 manufactured by Shimadzu Corporation. When the average particle size is measured, the particles are dispersed in a solvent having high dispersibility such as water or alcohol so that the measurement is carried out.

The shapes of the plate-like particles are not particularly limited as long as the above-mentioned condition of the average aspect ratio is satisfied, and hence the shapes of the principle planes thereof may be one of a disk, a polygon, an ellipse and an irregular shape or may be some of them.

Next, specific examples of the plate-like particles are cited.

As inorganic plate-like particles, for example, the followings can be used: mica such as muscovite (white mica), phlogopite (brown mica), biotite (black mica), sericite (silk mica) and fluorphlogophite (synthetic mica); kaolin (clay); talc (talcum); montmorillonite; flaky aluminum oxide, titanium oxide, zinc oxide and silicon oxide, and mixtures thereof; plate-like calcium carbonate; and shape-controlled plate-like silver halide such as shape-controlled plate-like silver chloride, silver bromide, silver iodide, silver bromide iodide, silver bromide chloride, silver chloride iodide and silver bromide chloride iodide. In particular, a layered silicate mineral is preferable.

As the layered silicate mineral, for example, swelling clay minerals having the following structures are preferable; a mica structure, a kaolinite structure and a smectite structure. In particular, the smectite structure, which has a high degree of swelling, is preferable. This is because a solvent goes into between layers of the smectite structure, so that the swelling clay mineral has a swelling card house structure, thereby having an effect of greatly increasing the viscosity of the first liquid mixture.

The layered silicate mineral cannot demonstrate the effect of increasing the strength of phosphor layers and the viscosity of the first liquid mixture well when the content of the layered silicate mineral in the first liquid mixture is less than 1 wt %. On the other hand, when the content of the layered silicate mineral therein is more than 20 wt %, transparency after heating decreases. Therefore, the content of the layered silicate mineral is preferably 1 wt % or more and 20 wt % or less and far preferably 1 wt % or more and 10 wt % or less.

The layered silicate mineral with the surface modified (surface treatment) with ammonium salt or the like can also be appropriately used in view of compatibility with a solvent.

(1.2.2) Inorganic Particle

Although using the plate-like particles can make the strength of the phosphor layer and the viscosity of the first liquid mixture high, addition of inorganic particles (oxide fine particles or the like) as needed can make the strength of the phosphor layer and the viscosity of the first liquid mixture higher.

The inorganic particles not only have a viscosity increasing effect of increasing the viscosity of the liquid mixture but also have a filling-up effect of filling up the gap produced on the interface between the organic metal compound and the phosphor and a film strengthening effect of increasing the film strength of heated ceramic layers (wavelength converting parts).

Examples of the inorganic particles used for the present invention include: oxide fine particles of silicon oxide (silica, for example), titanium oxide and zinc oxide; and fluoride fine particles of magnesium fluoride. In particular, when an organic compound containing silicon such as polysiloxane is used as the organic metal compound, it is preferable to use fine particles of silicon oxide in view of stability to the ceramic layer to be formed.

When the content of the inorganic particles in a ceramic layer is less than 1 wt %, each of the above-mentioned effects cannot be demonstrated well. On the other hand, when the content of the inorganic particles therein is more than 20 wt %, the strength of the heated ceramic layer is low. Therefore, the content of the inorganic particles in a ceramic layer is preferably 1 wt % or more and 20 wt % or less and far preferably 1 wt % or more and 10 wt % or less. In addition, the average particle size of the inorganic particles is preferably 0.001 μm or more and 50 μm or less in view of each of the above-mentioned effects. The average particle size of the inorganic particles can be measured by using, for example, a particle size analyzer SALD-7000 manufactured by Shimadzu Corporation.

(1.3) Dispersion Medium

As the dispersion medium, polyhydric alcohol having a valence of two or more is used.

Using the polyhydric alcohol having a valence of two or more as the dispersion medium can make the viscosity of the first liquid mixture high and demonstrate an effect of preventing the phosphor from precipitating more easily than using other alcohol.

As the polyhydric alcohol having a valence of two or more, any alcohol can be used as long as the alcohol can be used as a solvent. Examples thereof include ethylene glycol, propylene glycol, diethylene glycol, glycerine, 1,3-butanediol and 1,4-butanediol.

The polyhydric alcohol having a valence of two or more usually has a higher boiling point than monohydric alcohol having a valence of one and accordingly can prevent phosphor aggregation at an opening part of a nozzle of a spray device and clogging of the nozzle caused by evaporation of the dispersion medium.

In view of drying after applying the first liquid mixture onto the light emitting element, as the polyhydric alcohol having a valence of two or more, one having a boiling point of 250° C. or lower is preferable. When the boiling point is higher than 250° C., evaporation of the dispersion medium is slow, and hence the first liquid mixture applied onto the light emitting element runs, and the phosphor thereof tends to be unevenly distributed, and accordingly an even phosphor layer is difficult to be formed. On the other hand, when the boiling point is 250° C. or lower, the first liquid mixture applied onto the light emitting element does not run and can be dried with the phosphor thereof evenly distributed, and accordingly an even phosphor layer can be formed.

To be more specific, as the polyhydric alcohol having a valence of two or more, ethylene glycol, propylene glycol, 1,3-butanediol and 1,4-butanediol are preferable.

(1.4) Preparation of First Liquid Mixture (Phosphor Application Liquid)

As a preparation procedure of the first liquid mixture, the phosphor and the plate-like particles are simply mixed into the dispersion medium. The first liquid mixture may contain the inorganic particles and/or a dispersion medium such as isopropyl alcohol other than the above-mentioned dispersion medium.

As the dispersion medium, the polyhydric alcohol having a valence of two or more can be used as described above. Instead, a mixed dispersion medium in which the polyhydric alcohol having a valence of two or more and a dispersion medium (solvent) having a boiling point of 100° C. or lower such as isopropyl alcohol are mixed can foe used. Using the mixed dispersion medium enables the evaporation speed of the dispersion medium of the first liquid mixture applied onto the light emitting element to be adjusted to a desired speed.

When the mixed dispersion medium in which the polyhydric alcohol having a valence of two or more and the dispersion medium having a boiling point of 100° C. or lower are mixed is used as the dispersion medium, a ratio of the dispersion medium (solvent; having a boiling point of 100° C. or lower with respect to the polyhydric alcohol having a valence of two or more is preferably 0.70 or more and 1.50 or less. As the dispersion medium (solvent) having a boiling point of 100° C. or lower, isopropyl alcohol, ethanol, methanol, n-propanol and pure water are preferable.

The viscosity of the first liquid mixture is from 10 cP to 1000 cP, preferably from 12 cP to 500 cP and far preferably from 20 cp to 400 cP.

When the phosphor application liquid is prepared by dispersing the phosphor and the plate-like particles in the ceramic precursor solution, a chemical reaction may occur when some time has elapsed since its preparation, and the viscosity thereof may increase to a viscosity which is not suitable to apply, so that a pot life thereof becomes short. However, like the first liquid mixture, when the liquid is prepared in such a way not to contain a ceramic precursor, the viscosity thereof does not increase, so that the pot life thereof can be long.

The first liquid mixture is an example of a phosphor mixture.

(1.5) Application of First Liquid Mixture (1.5.1) Application Device

Figure 2:
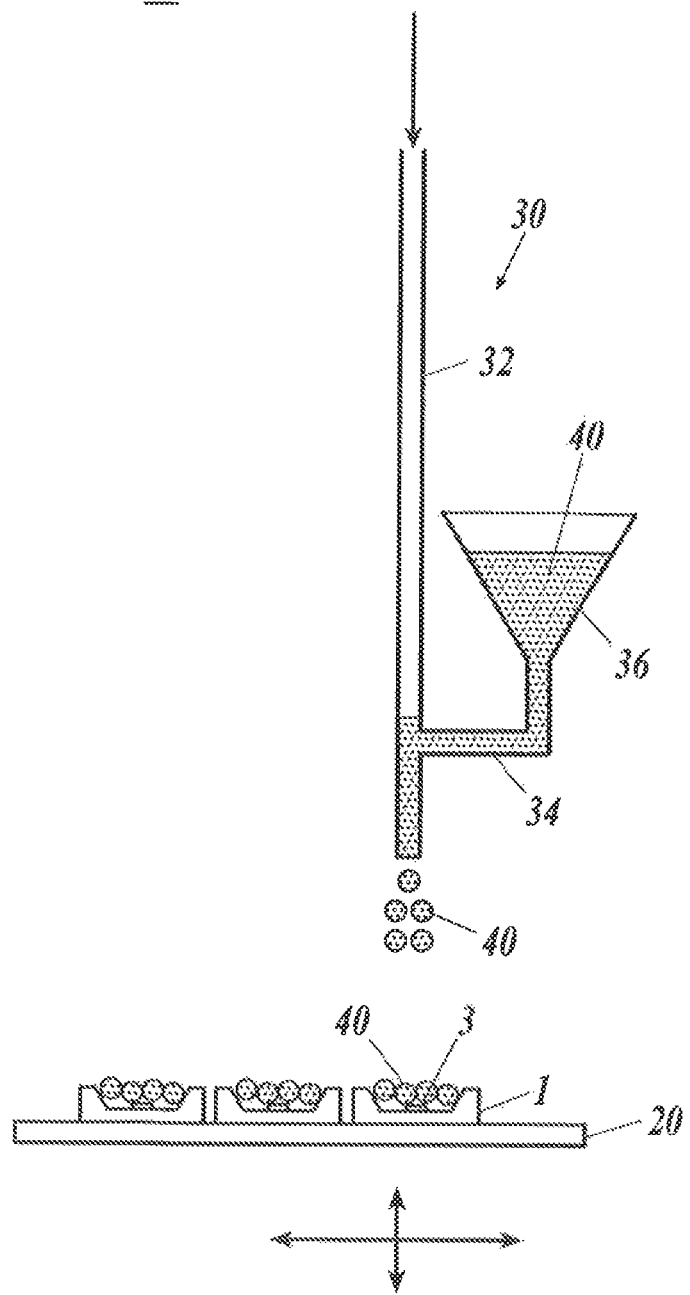
FIG. 2 is a schematic view for explaining a manufacturing device (application device) and a manufacturing method for the light emitting device.

For the application of the first liquid mixture, for example, an application device 10 shown in FIG. 2 is used.

The application device 10 mainly includes a movable support 20 which can move up, down, left, right, forward and backward and a spray device 30 which can jet the above-described first liquid mixture (40).

The spray device 30 is disposed above the movable support 20.

The spray device 30 includes a nozzle 32 to which the air is supplied, and an air compressor (not shown) to supply the air is connected to the nozzle 32. The bore of the tip part of the nozzle 32 is from 20 µm to 2 mm, preferably from 0.1 mm to 0.3 mm. The nozzle 32 can move up, down, left, right, forward and backward, like the movable support 20.

As the nozzle 32 and the compressor, for example, a spray gun W-101-142BPG and an OFP-071C both manufactured by ANEST IWATA Corporation are used, respectively.

The angle of the nozzle 32 can be adjusted, so that the nozzle 32 can be inclined with respect to the movable support 20 (or the package 1 set thereon). The angle of the nozzle 32 to a jetting target (package 1) is preferably within a range of 0° to 60° with the vertical direction from the jetting target referred to as 0°.

To the nozzle 32, a tank 36 is connected via a connecting pipe 34. In the tank 36, the first liquid mixture 40 is stored. In the tank 36, a stirring chip is put, so that the first liquid mixture 40 is always stirred. Stirring the first liquid mixture 40 can prevent the phosphor, the specific gravity of which is high, from precipitating, so that a state in which the phosphor is dispersed in the first liquid mixture 40 can be maintained.

As the tank, for example, a PC-51 manufactured by ANEST IWATA Corporation is used.

(1.5.2) Application of First Liquid Mixture

When the first liquid mixture 40 is actually applied, a plurality of packages 1 (on which LED elements 3 are mounted in advance) are set on the movable support 20, and the positional relationship between the packages 1 and the nozzle 32 of the spray device 30 is adjusted (a position-adjusting step).

More specifically, the packages 1 are set on the movable support 20 in such, a way as to face the tip part of the nozzle 32. The longer the distance between the packages 1 and the nozzle 32 is, the more evenly the first liquid mixture 40 can be applied, to the packages 1, but the film strength, tends to be lower. Hence, the distance between the packages 1 and the tip part of the nozzle 32 is suitable to be kept within a range of 3 cm to 30 cm.

After that, the first liquid mixture 40 is jetted from the nozzle 32 to be applied to the packages 1 (a jetting/applying step) while the packages 1 and the nozzle 32 are moved in relation to each other.

More specifically, on one hand, the movable support 20 and the nozzle 32 are moved so that the packages 1 and the nozzle 32 are moved left, right, forward and/or backward. One of the movable support 20 and the nozzle 32 may be fixed and the other thereof may be moved left, right, forward and/or backward. A method of disposing a plurality of LED elements 3 in a direction perpendicular to a moving direction of the movable support 20 and carrying out the application while moving the nozzle 32 in the direction perpendicular to the moving direction of the movable support 20 can also be used by preference. On the other hand, the air is supplied to the nozzle 32, and the first liquid, mixture 40 is jetted from the tip part of the nozzle 32 to the packages 1. The distance between the packages 1 and the nozzle 32 is adjustable within the above-mentioned range in view of the pressure of the air compressor. For example, the pressure of the compressor is adjusted in such a way that the pressure of the entrance part (i.e. the tip part) of the nozzle 32 is 0.14 MPa.

By the above-described operation, the first liquid mixture 40 can be applied onto the LED elements 3, and after that, the applied first liquid mixture 40 is heated to be dried, so that phosphor layers can be formed.

By adjusting the spray distance, the pressure and the angle, which are described above, and a moving speed, of the nozzle 32, the application amount of the first liquid mixture 40 onto the packages 1 can be adjusted, and accordingly desired chromaticity can be obtained. For example, when the first liquid mixture 40 prepared in a certain mixing ratio is applied onto fixed packages 1 with the nozzle 32 moving, the faster the moving speed of the nozzle 32 is, the shorter the time available to apply the first liquid, mixture 40 onto the packages 1 is, and hence the less the application amount thereof is.

The application amount of the second liquid mixture can be adjusted in the same manner, and accordingly desired film strength can be obtained.

When the first liquid mixture 40 is applied onto the LED elements 3, the packages 1 may be heated to be of 50° C. or higher and 250° C. or lower.

Heating the packages 1 enables the evaporation speed of the first liquid mixture 40 on the LED elements 3 to be adjusted, so that, for example, even when, a dispersion medium having a boiling point of higher than 250° C. is used for the first liquid mixture 40, the first liquid mixture 40 can be prevented from running on the LED elements 3.

Next, the second liquid mixture (ceramic precursor) used at the step (2) and details of the step (2) are described.

(2.1) Second Liquid Mixture (Ceramic Precursor Solution)

The second liquid mixture is a solution in which a metal compound as a ceramic precursor is dispersed in a solvent. The type of the metal is not particularly limited as long as the metal can form translucent ceramics.

(2.1.1) Sol-Gel Solution

The second liquid mixture may be a solution (sol-gel solution) which forms ceramics by the solution gelling through, a reaction such as hydrolysis and then the gel being heated or a solution which directly forms ceramics by a solvent component thereof being volatilized without gelling.

In the case of the former (sol-gel solution), the metal compound, may be an organic compound or an inorganic compound. Preferred examples of the metal compound include metal alkoxide, metal acetylacetonate metal, carboxylate, nitrate and oxide. Among them, metal alkoxide, tetraethoxysilane in particular, is preferable because it easily gels through hydrolysis and a polymerization reaction. A plurality of types of the metal compound may be combined to use. It is preferable that as the second liquid mixture, for example, water for hydrolysis, a solvent and/or a catalyst are contained in addition to the above-described metal compound.

Examples of the solvent include alcohol such as methanol, ethanol, propanol and butanol.

Examples of the catalyst include hydrochloric acid, sulfuric acid, nitric acid, acetic acid, hydrofluoric acid and ammonia.

When tetraethoxysilane is used as the metal compound, 138 mass parts of ethyl alcohol and 52 mass parts of pure water per 100 mass parts of tetraethoxysilane are preferable. In this case, a heating temperature to heat the gel is preferably from 120° C. to 250° C. and, in view of prevention of deterioration of the LED elements 3 and the like, far preferably from 120° C. to 200° C. When polysiloxane is used as the metal compound, the heating temperature after the application is preferably from 120° C. to 500° C. and, in view of prevention of deterioration of the LED elements 3 and the like, far preferably from 120° C. to 200° C. As the polysiloxane used as the metal compound, silsesquioxane having an alkyl group or a phenyl group can also be used.

(2.1.2) Polysilazane

As the ceramic precursor, polysilazane can also be used.

The polysilazane used for the present invention is represented by the following General Formula (i).

$$(R^1R^2SiNR^3)_n \quad (1)$$

In Formula (i), R1, R2 and R3 each independently represent a hydrogen atom, an alkyl group, an aryl group, a vinyl group or a cycloalkyl group, provided that at least one of R1, R2 and R3 represents a hydrogen, atom, preferably all of them represent hydrogen atoms; and n represents an integer of 1 to 60.

The molecular shape of the polysilazane can be any and hence, for example, linear or cyclic.

The polysilazane represented by Formula (i) is dissolved in a suitable solvent optionally with a reaction accelerator and applied and then heated or irradiated with excimer light or UV light so as to be cured, whereby a ceramic film having excellent, resistance to heat and light can be formed. In particular, thermal curing after irradiation curing with UVU radiation containing a wavelength, component within a range of 170 nm to 230 nm (for example, excimer light) can further improve an effect of preventing water permeation.

It is preferable to use acid, a base or the like as the reaction accelerator, but the reaction accelerator is not essential. Examples of the reaction accelerator include, but not limited to, triethylamine, diethylamine, N,N-diethylethanolamine, N,N-dimethylethanolamine, triethanolamine, triethylamine, hydrochloric acid, oxalic acid, fumaric acid, sulfonic acid and acetic acid; and metal carboxylate containing nickel, iron, palladium, iridium, platinum, titanium or aluminum.

When the reaction accelerator is used, metal carboxylate is preferable in particular, and the addition amount thereof is preferably from 0.01 mol % to 3 mol % based on the polysilazane.

As the solvent, aliphatic hydrocarbon, aromatic hydrocarbon, halogen, hydrocarbon, ether and ester can be used. Preferred examples thereof include methyl ethyl ketone, tetrahydrofuran, benzene, toluene, xylene, dimethyl fluoride, chloroform, carbon tetrachloride, ethyl ether, isopropyl ether, dibutyl ether and ethyl butyl ether.

The higher the polysilazane concentration is, the far preferable it is. However, increase of the concentration leads to shortening of a preservation period of the polysilazane.

Therefore, it is preferable that the polysilazane be dissolved in the solvent at 5 mass % to 50 mass %.

When the polysilazane is used as the ceramic precursor, the heating temperature after the application is preferably from 120° C. to 500° C. and, in view of prevention of deterioration of the LED elements 3 and the like, far preferably from 120° C. to 200° C.

(2.2) Application of Second Liquid Mixture

For the application of the second liquid mixture, as is the case with the application of the first liquid mixture, the application device 10 shown in FIG. 2 is used. The second liquid mixture can be applied onto the phosphor layers, and wavelength converting parts 6 can be formed (completed) by firing the applied second liquid mixture thereafter.

According to the embodiment, particular plate-like particles are contained in the first liquid mixture 40, so that the strength of phosphor layers formed by applying and drying the first liquid mixture 40 is increased, and separation of the phosphor layers can be prevented, and by extension, the chromaticity variation of manufactured light emitting devices 100 can be reduced.

Further, after the phosphor layers are formed by heating the first liquid mixture (phosphor application solution) to dry, the second liquid mixture (ceramic precursor solution) is applied onto the phosphor layers, so that the second liquid mixture can be impregnated into the phosphor layers. Thereafter, the second liquid mixture is fired, so that wavelength converting parts 6 can have sufficient strength.

Instead of the application device 30, a dispenser or an ink-jet device may be used to apply (drop or discharge) the phosphor application solution (first liquid mixture 40) and the ceramic precursor solution (second liquid mixture).

When a dispenser is used, a nozzle to be used is one which can control the drop amount of an application liquid and does not cause nozzle clogging with phosphor thereof or the like. For example, a non-contact JET dispenser or another dispenser manufactured by Musashi Engineering, Inc. can be used.

When an ink-jet device is used, a nozzle to be used is one which can control the discharge amount of an application liquid and does not cause nozzle clogging with phosphor thereof or the like. For example, an ink-jet device manufactured by Konica Minolta IJ Technologies, Inc. can be used.

EXAMPLE (1) Preparation of Sample (1.1) LED Device

Blue LEDs each having a size of 200 μm (length)*200 μm (width)×200 μm (height) were each mounted in a circular package having an opening size of 3 mm, a bottom diameter of 2 mm and a wall surface angle of 60° through flip-chip bonding.

(1.2) Phosphor

Yellow phosphor particles were prepared by the following procedure.

An aluminum crucible was filled with a mixture in which the following phosphor materials were mixed well, and as a flux, a suitable amount of fluoride such as ammonium fluoride was mixed therein. The resulting product was fired at a temperature range of 1350° C. to 1450° C. for two to five hours in a reducing atmosphere where a hydrogen-containing nitrogen gas was circulated. Thus, a fired product $((Y_{0.72}Gd_{0.24})_3Al_5O_{12}:Ce_{0.04})$ was obtained.

$Y_2O_3$ . . . 7.41 g
$Gd_2O_3$ . . . 4.01 g
$CeO_2$ . . . 0.63 g
$Al_2O_3$ . . . 7.77 g

Thereafter, the obtained fired product was pulverized, washed, separated and dried to obtain desired phosphor. The obtained phosphor was pulverized into phosphor particles having a particle size of about 10 μm and used. With respect to the obtained phosphor, the composition was analyzed, and it was confirmed that the phosphor was the desired phosphor, and also the emission wavelength in excitation light of a wavelength of 465 nm was examined, and it was found that the peak emission wavelength was a wavelength of about 570 nm.

(2) Production of Sample

The numerical values of "g" shown in the following examples and comparative examples are each a mass ratio of a component in a liquid and hence different from the amount actually prepared.

(2.1) Comparative Example 1

A liquid mixture was produced by mixing 0.85 g of the phosphor and 2.14 g of a polysiloxane dispersion liquid (14 mass % of polysiloxane and 86 mass % of IPA). The liquid mixture had a viscosity of 3 cp. This liquid mixture was sprayed, to be applied onto the LED devices by using the application device shown in FIG. 2 and fired for one hour at 150° C., whereby wavelength converting parts were formed.

The spray pressure was 0.1 MPa, and the speed (application, speed) of the spray nozzle moving over the packages was 50 mm/s. The distance from, the spray nozzle to samples was 15 cm. The distance from the spray nozzle to samples is a distance from the spray nozzle to each of the samples when the spray nozzle passes through just over each of the packages.

(2.2) Comparative Example 2

The first liquid mixture was produced by mixing 0.85 g of the phosphor and 1 g of propylene glycol. This first liquid mixture was sprayed to be applied onto the LED devices by using the application device shown in FIG. 2 and dried for one hour at 50° C., whereby phosphor layers were formed.

The spray pressure was 0.1 MPa, and the speed of the spray nozzle moving over the packages was 80 mm/s. The distance from the spray nozzle to samples was 15 cm.

After that, from above the precursor of the wavelength converting parts, a polysiloxane dispersion liquid (14 mass % of polysiloxane and 86 mass % of IPA) was sprayed to be applied, thereto as the second liquid mixture and fired for one hour at 150° C., whereby the wavelength converting parts were fixed and completed. Here, the spray pressure was 0.1 MPa, and the speed of the spray nozzle moving over the packages was 70 mm/s.

(2.3) Comparative Example 3

The first liquid mixture was produced by mixing 0.04 g of inorganic particles (RX300 with a particle size of 7 nm manufactured by Nippon Aerosil Co., Ltd.) and 0.81 g of the phosphor into 1 g of propylene glycol. This first liquid mixture was sprayed to be applied onto the LED devices by using the application device shown in FIG. 2 and dried for one hour at 50° C., whereby phosphor layers were formed.

After that, from above the phosphor layers, a polysiloxane dispersion liquid (14 mass % of polysiloxane and 86 mass % of IPA) was sprayed to be applied thereto as the second liquid mixture and fired for one hour at 150° C., whereby the phosphor of the phosphor layers was fixed, and wavelength converting parts were formed.

The spray application condition was the same as that of the comparative example 2 except that the spray pressure of the first liquid mixture was 0.15 MPa.

(2.4) Example 1

The first liquid mixture was produced by mixing 0.04 g of synthetic mica (MICROMICA MK-100 with an average particle size of 4 μm manufactured by Co-op Chemical Co., Ltd.) and 0.81 g of the phosphor into 1 g of propylene glycol. This first liquid mixture was sprayed to be applied onto the LED devices by using the application device shown in FIG. 2 and dried for one hour at 50° C., whereby phosphor layers were formed.

After that, from above the phosphor layers, a polysiloxane dispersion liquid (14 mass % of polysiloxane and 86 mass % of IPA) was sprayed to be applied thereto as the second liquid mixture and fired for one hour at 150° C., whereby the phosphor of the phosphor layers was fixed, and wavelength converting parts were formed.

The spray application condition was the same as that of the comparative example 3.

(2.5) Example 2

The first liquid mixture was produced by mixing 0.04 g of inorganic particles (RX300 with a particle size of 7 nm manufactured by Nippon. Aerosil Co., Ltd.), 0.04 g of smectite (LUCENTITE SWN with an average particle size of 50 nm manufactured by Co-op Chemical Co., Ltd.) and 0.77 g of the phosphor into 1 g of ethylene glycol. This first liquid mixture was sprayed to be applied onto the LED devices by using the application device shown in FIG. 2 and dried for one hour at 50° C., whereby phosphor layers were formed.

After that, from above the phosphor layers, a polysiloxane dispersion liquid (14 mass % of polysiloxane and 86 mass % of IPA) was sprayed to be applied thereto as the second liquid mixture and fired for one hour at 150° C., whereby the phosphor of the phosphor layers was fixed, and wavelength converting parts were formed.

As to the spray application condition, the application speed of the first liquid mixture was 50 mm/s, the spray pressure thereof was 0.15 MPa, the application speed of the second liquid mixture was 70 mm/s, and the spray speed thereof was 0.1 MPa.

(2.6) Example 3

The first liquid mixture was produced, by mixing 0.065 g of inorganic particles (RX300 with a particle size of 7 nm manufactured by Nippon Aerosil Co., Ltd.), 0.025 g of smectite (LUCENTITE SWN with an a verage particle size of 50 nm manufactured by Co-op Chemical Co., Ltd.) and 1 g of the phosphor into 1 g of propylene glycol and 0.75 g of isopropyl alcohol. This first liquid mixture was sprayed to be applied onto the LED devices by using the application device shown in FIG. 2 and dried for one hour at 50° C., whereby phosphor layers were formed.

After that, from above the phosphor layers, a polysiloxane dispersion liquid (14 mass % of polysiloxane and 86 mass % of IPA) was sprayed to be applied thereto as the second liquid mixture and fired for one hour at 150° C., whereby the phosphor of the phosphor layers was fixed, and wavelength converting parts were formed.

The spray application condition was the same as that of the example 2.

(2.7) Example 4

The first liquid mixture was produced by mixing 0.065 g of inorganic particles (RX300 with a particle size of 7 nm manufactured by Nippon Aerosil Co., Ltd.), 0.025 g of smectite (LUCENTITE SWN with an average particle size of 50 nm manufactured by Co-op Chemical Co., Ltd.) and 1 g of the phosphor into 1 g of propylene glycol and 1 g of isopropyl alcohol. This first liquid mixture was sprayed to be applied onto the LED devices by using the application device shown in FIG. 2 and dried for one hour at 50° C., whereby phosphor layers were formed.

After that, from above the phosphor layers, a polysiloxane dispersion liquid (14 mass % of polysiloxane and 86 mass % of IPA) was sprayed to be applied thereto as the second liquid mixture and fired for one hour at 150° C., whereby the phosphor of the phosphor layers was fixed, and wavelength converting parts were formed.

The spray application condition was the same as that of the example 2.

(2.8) Example 5

The first liquid mixture was produced by mixing 0.065 g of inorganic particles (RX300 with a particle size of 7 nm manufactured by Nippon Aerosil Co., Ltd.), 0.025 g of smectite (LUCENTITE SWN with an average particle size of 50 nm manufactured by Co-op Chemical Co., Ltd.) and 1 g of the phosphor into 1 g of 1,3-butanediol and 0.75 g of isopropyl alcohol. This first liquid mixture was sprayed to be applied onto the LED devices by using the application device shown in FIG. 2 and dried for one hour at 50° C., whereby phosphor layers were formed.

After that, from above the phosphor layers, a polysiloxane dispersion liquid (14 mass % of polysiloxane and 86 mass % of IPA) was sprayed to be applied thereto as the second liquid mixture and fired for one hour at 150° C., whereby the phosphor of the phosphor layers was fixed, and wavelength converting parts were formed.

The spray application condition was the same as that of the example 2.

(2.9) Example 6

The first liquid mixture was produced by mixing 0.065 g of inorganic particles (RX300 with a particle size of 7 nm manufactured, by Nippon Aerosil Co., Ltd.), 0.025 g of smectite (LUCENTITE SWN with an average particle size of 50 nm manufactured by Co-op Chemical Co., Ltd.) and 1 g of the phosphor into 0.75 g of 1,3-butanediol and 1 g of isopropyl alcohol. This first liquid mixture was sprayed to be applied, onto the LSD devices by using the application device shown in FIG. 2 and dried for one hour at 50° C., whereby phosphor layers were formed.

After that, from above the phosphor layers, a polysiloxane dispersion liquid (14 mass % of polysiloxane and 86 mass % of IPA) was sprayed to be applied thereto as the second liquid mixture and fired for one hour at 150° C., whereby the phosphor of the phosphor layers was fixed, and wavelength converting part were formed.

The spray application condition was the same as that of the example 2.

(2.10) Example 7

Samples of the example 7 were produced in the same manner as the samples of the example 1 except that smectite (LUCENTITE SWN with an average particle size of 50 nm manufactured by Co-op Chemical Co., Ltd.) was used instead of synthetic mica, and polysilazane (NL120 (20 mass %) manufactured by AZ Electronic Materials plc) was used as the second liquid mixture.

As to the spray application condition, the application speed of the first liquid mixture was 70 mm/s, the spray pressure thereof was 0.15 MPa, the application, speed of the second liquid mixture was 70 mm/s, and the spray pressure thereof was 0.1 MPa.

(2.11) Example 8

Samples of the example 8 were produced in the same manner as the samples of the example 3 except that polysilazane (NN120 (20 mass %) manufactured, by AZ Electronic Materials plc) was used as the second liquid mixture.

The spray application condition was the same as that of the example 2.

(2.12) Example 9

Samples of the example 9 were produced in the same manner as the samples of the example 3 except that 1,3-butanediol was used for the first liquid mixture instead of propylene glycol, and polysilazane (NN120 (20 mass %) manufactured by AZ Electronic Materials plc) was used as the second liquid mixture.

The spray application condition was the same as that of the example 2.

(3) Evaluation of Sample (3.1) Measurement of Viscosity

The viscosity of the first liquid mixture was measured by using a vibration type viscometer (VM-10A-L manufactured by CBC Co., Ltd.) as a measuring device. The measurement was carried out after the produced first liquid mixture was kept still for one hour. The measurement result is shown in TABLE 1 with the composition of each sample. The measured value of the viscosity is a value obtained one minute after from the start of the measurement.

(3.2) Evaluation of Chromaticity Variation

Among the samples produced under each condition, five samples were selected and the chromaticity of each sample was measured. The samples were compared with each other in chromaticity difference. As a measuring device, a spectroradiometer CS-1000A manufactured by Konica Minolta Sensing, Inc. was used.

After that, standard deviations were calculated from the measured values so that evenness of the chromaticity was evaluated. The result is shown in TABLE 2. It was decided that, as an indicator of the evaluation, a standard, deviation being 0.02 or less indicated no problem in practical use from the perspective of the chromaticity variation. The evaluation was made by using the average value of the standard deviations and shown by the following criteria (⊚, ○ and x).

⊚ (double circle) . . . 0.01 or less
○ (circle) . . . more than 0.01 and not more than 0.02
x (cross) . . . more than 0.02

TABLE 1

| SAMPLE | FIRST LIQUID MIXTURE | | | SECOND LIQUID MIXTURE |
|---|---|---|---|---|
| | PARTICLE | SOLVENT | VISCOSITY (cp) | CERAMIC PRECURSOR |
| COMPARATIVE EXAMPLE 1 | — | — | — | POLYSILOXANE |
| COMPARATIVE EXAMPLE 2 | — | PROPYLENE GLYCOL | 50 | |
| COMPARATIVE EXAMPLE 3 | SPHERICAL PARTICLE (SILICA) | | 150 | |
| EXAMPLE 1 | PLATE-LIKE PARTICLE (MICA) | PROPYLENE GLYCOL | 180 | POLYSILOXANE |
| EXAMPLE 2 | PLATE-LIKE PARTICLE (SMECTITE) + SPHERICAL PARTICLE (SILICA) | ETHYLENE GLYCOL | 400 | |
| EXAMPLE 3 | | PROPYLENE GLYCOL + IPA | 300 | |
| EXAMPLE 4 | | PROPYLENE GLYCOL + IPA | 280 | |
| EXAMPLE 5 | | 1,3-BUTANEDIOL + IPA | 320 | |
| EXAMPLE 6 | | 1,3-BUTANEDIOL + IPA | 300 | |
| EXAMPLE 7 | PLATE-LIKE PARTICLE (SMECTITE) | PROPYLENE GLYCOL | 200 | POLYSILAZANE |
| EXAMPLE 8 | PLATE-LIKE PARTICLE (SMECTITE) + SPHERICAL PARTICLE (SILICA) | PROPYLENE GLYCOL + IPA | 300 | |
| EXAMPLE 9 | | 1,3-BUTANEDIOL + IPA | 320 | |

TABLE 2

| | CHROMATICITY | 1 | 2 | 3 | 4 | 5 | STANDARD DEVIATION ACTUAL VALUE | STANDARD DEVIATION AVERAGE (EVALUATION) |
|---|---|---|---|---|---|---|---|---|
| COMPARATIVE EXAMPLE 1 | x VALUE | 0.38 | 0.325 | 0.328 | 0.318 | 0.355 | 0.0258 | 0.0256 (X) |
| | y VALUE | 0.39 | 0.34 | 0.354 | 0.325 | 0.37 | 0.0254 | |
| COMPARATIVE EXAMPLE 2 | x VALUE | 0.315 | 0.285 | 0.335 | 0.309 | 0.27 | 0.0256 | 0.0252 (X) |
| | y VALUE | 0.33 | 0.295 | 0.35 | 0.32 | 0.29 | 0.0249 | |
| COMPARATIVE EXAMPLE 3 | x VALUE | 0.265 | 0.27 | 0.31 | 0.32 | 0.29 | 0.0241 | 0.0229 (X) |
| | y VALUE | 0.28 | 0.29 | 0.325 | 0.33 | 0.3 | 0.0218 | |
| EXAMPLE 1 | x VALUE | 0.3 | 0.335 | 0.325 | 0.33 | 0.315 | 0.0139 | 0.0134 (○) |
| | y VALUE | 0.315 | 0.35 | 0.335 | 0.34 | 0.33 | 0.0129 | |
| EXAMPLE 2 | x VALUE | 0.325 | 0.314 | 0.322 | 0.33 | 0.324 | 0.0058 | 0.0065 (◎) |
| | y VALUE | 0.335 | 0.325 | 0.335 | 0.32 | 0.335 | 0.0071 | |
| EXAMPLE 3 | x VALUE | 0.327 | 0.325 | 0.328 | 0.332 | 0.315 | 0.0063 | 0.0084 (◎) |
| | y VALUE | 0.34 | 0.335 | 0.34 | 0.345 | 0.328 | 0.0064 | |
| EXAMPLE 4 | x VALUE | 0.334 | 0.33 | 0.344 | 0.325 | 0.328 | 0.0074 | 0.0072 (◎) |
| | y VALUE | 0.34 | 0.338 | 0.35 | 0.332 | 0.3335 | 0.0071 | |
| EXAMPLE 5 | x VALUE | 0.324 | 0.33 | 0.328 | 0.325 | 0.338 | 0.0056 | 0.0058 (◎) |
| | y VALUE | 0.338 | 0.346 | 0.342 | 0.342 | 0.354 | 0.0061 | |
| EXAMPLE 6 | x VALUE | 0.332 | 0.342 | 0.338 | 0.328 | 0.342 | 0.0062 | 0.0061 (◎) |
| | y VALUE | 0.342 | 0.35 | 0.342 | 0.336 | 0.35 | 0.0060 | |
| EXAMPLE 7 | x VALUE | 0.318 | 0.332 | 0.33 | 0.324 | 0.335 | 0.0068 | 0.0075 (◎) |
| | y VALUE | 0.325 | 0.34 | 0.345 | 0.34 | 0.345 | 0.0082 | |
| EXAMPLE 8 | x VALUE | 0.332 | 0.318 | 0.335 | 0.328 | 0.342 | 0.0089 | 0.0086 (◎) |
| | y VALUE | 0.345 | 0.333 | 0.35 | 0.342 | 0.355 | 0.0083 | |
| EXAMPLE 9 | x VALUE | 0.321 | 0.332 | 0.32 | 0.338 | 0.334 | 0.0081 | 0.0071 (◎) |
| | y VALUE | 0.334 | 0.342 | 0.338 | 0.35 | 0.345 | 0.0082 | |

(4) Conclusion

In the samples of the comparative example 1, since the application liquid in which the phosphor and the ceramic precursor were mixed was applied, namely, they were not separately applied, and also the application liquid did not contain plate-like particles, the viscosity of the application liquid, itself was low, and the chromaticity variation was large.

In the samples of the comparative example 2, since the first liquid mixture did not contain plate-like particles, the strength of the phosphor layers was low, separation of the phosphor layers was seen when the second liquid mixture was applied, and the chromaticity variation was present.

In the samples of the comparative example 3, although the first liquid mixture contained the spherical particles, the strength of the phosphor layers was not increased, and in this comparative example too, separation of the phosphor layers was seen when the second liquid, mixture was applied, and the chromaticity variation, was present.

On the other hand, in the samples of the examples 1 to 9, the strength of the phosphor layers was increased, and the chromaticity variation was reduced.

As a result, it can be known that when an application liquid is applied at two steps, namely, the first step of applying a first liquid mixture containing phosphor but not containing a ceramic precursor and the second step of applying a second liquid mixture containing the ceramic precursor, the first liquid mixture containing plate-like particles is effective in preventing separation of a phosphor layer formed at the first step and reducing the chromaticity variation of light emitting devices.

In particular, comparison between the example 1 and the examples 2 to 9 indicates that when a layered silicate mineral having a smectite structure is used as the plate-like particles, the effect is significant.

INDUSTRIAL APPLICABILITY

The present invention can be suitably applied to preventing separation of a phosphor layer and reducing the chromaticity variation.

EXPLANATION OF REFERENCES

1 Package
2 Metal Part
3 LED Element
4 Protruding Electrode (Bump)
6 Wavelength Converting Part
10 Application Device
20 Movable Support
30 Spray Device
32 Nozzle
34 Connecting Pipe
36 Tank
40 First Liquid Mixture
100 Light Emitting Device

The invention claimed is:

1. A manufacturing method for a light emitting device including a light emitting element and a wavelength converting part which converts light emitted from the light emitting element into light of another wavelength, the manufacturing method comprising:
   a step of applying onto the light emitting element and drying a first liquid mixture in which phosphor and plate-like particles are dispersed in polyhydric alcohol having a valence of two or more to form a phosphor layer; and
   a step of applying onto the phosphor layer and firing a second liquid mixture in which a translucent ceramic precursor is dispersed in a solvent to form the wavelength converting part,
   wherein the plate-like particles have an average aspect ratio of 10 or more, and
   the plate-like particles are of a layered silicate mineral,
   to lower the chromaticity variation.

2. The manufacturing method for the light emitting device according to claim 1, wherein the polyhydric alcohol has a boiling point of 250° C. or lower.

3. The manufacturing method for the light emitting device according to claim 1, wherein the first liquid mixture is a liquid mixture obtained by dispersing the phosphor and the plate-like particles having a particle size smaller than a particle size of the phosphor in a mixed dispersion medium in which the polyhydric alcohol and a solvent having a boiling point of 100° C. or lower are mixed.

4. The manufacturing method for the light emitting device according to claim 3, wherein in the mixed dispersion medium, a ratio of the solvent with respect to the polyhydric alcohol is 0.70 or more and 1.50 or less.

5. The manufacturing method for the light emitting device according to claim 1, wherein the first liquid mixture has no ceramic precursor.

6. The manufacturing method for the light emitting device according to claim 1, wherein the first liquid mixture further comprises inorganic particles.

7. A phosphor mixture used in a manufacturing method for a light emitting device including a light emitting element and a wavelength converting part which converts light emitted from the light emitting element into light of another wavelength, the manufacturing method including:
   a step of applying onto the light emitting element and drying a first liquid mixture to form a phosphor layer; and
   a step of applying onto the phosphor layer and firing a second liquid mixture in which a translucent ceramic precursor is dispersed in a solvent to form the wavelength converting part, and the phosphor mixture comprising:
   phosphor;
   plate-like particles; and
   polyhydric alcohol having a valence of two or more,
   wherein the phosphor mixture is used as the first liquid mixture,
   the plate-like particles have an average aspect ratio of 10 or more, and
   the plate-like particles are of a layered silicate mineral,
   to lower the chromaticity variation.

8. The phosphor mixture according to claim 7, wherein the polyhydric alcohol has a boiling point of 250° C. or lower.

9. The phosphor mixture according to claim 7, wherein the phosphor mixture is a liquid mixture in which the phosphor and the plate-like particles having a particle size smaller than a particle size of the phosphor are dispersed in a mixed dispersion medium in which the polyhydric alcohol and a solvent having a boiling point of 100° C. or lower are mixed.

10. The phosphor mixture according to claim 9, wherein in the mixed dispersion medium, a ratio of the solvent with respect to the polyhydric alcohol is 0.70 or more and 1.50 or less.

11. The phosphor mixture according to claim 7, wherein the phosphor mixture has no ceramic precursor.

12. The phosphor mixture according to claim 7 further comprising inorganic particles.

13. A manufacturing method for a light emitting device including a light emitting element and a phosphor layer which is formed on the light emitting element, the manufacturing method comprising:
   a step of applying a phosphor mixture in which phosphor and plate-like particles are dispersed in polyhydric alcohol having a valence of two or more onto the light emitting element; and
   a step of drying the phosphor mixture which is applied onto the light emitting element to form a phosphor layer,
   the plate-like particles have an average aspect ratio of 10 or more, and
   the plate-like particles are of a layered silicate mineral,
   to lower the chromaticity variation.

14. The manufacturing method for the light emitting device according to claim 13, the manufacturing method further comprising:
   a step of applying a sealing agent onto the phosphor layer.

15. The manufacturing method for the light emitting device according to claim 13, wherein the phosphor mixture has no ceramic precursor.

16. The manufacturing method for the light emitting device according to claim 13, wherein the phosphor mixture further comprises inorganic particles.

17. A phosphor mixture used in a manufacturing method for a light emitting device including a light emitting element and a phosphor layer, the manufacturing method comprising:
   a step of applying onto the light emitting element and drying the phosphor mixture to form the phosphor layer, and the phosphor mixture comprising:
   phosphor;
   plate-like particles; and
   polyhydric alcohol having a valence of two or more,
   wherein the plate-like particles have an average aspect ratio of 10 or more, and
   the plate-like particles are of a layered silicate mineral,
   to lower the chromaticity variation.

18. The phosphor mixture according to claim 17, wherein the phosphor mixture has no ceramic precursor.

19. The phosphor mixture according to claim 17 further comprising inorganic particles.

* * * * *